United States Patent
Deval

(10) Patent No.: US 7,102,558 B2
(45) Date of Patent: Sep. 5, 2006

(54) FIVE-LEVEL FEED-BACK DIGITAL-TO-ANALOG CONVERTER FOR A SWITCHED CAPACITOR SIGMA-DELTA ANALOG-TO-DIGITAL CONVERTER

(75) Inventor: Philippe Deval, Lutry (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/195,280

(22) Filed: Aug. 2, 2005

(65) Prior Publication Data

US 2006/0055581 A1    Mar. 16, 2006

Related U.S. Application Data

(60) Provisional application No. 60/603,234, filed on Aug. 20, 2004.

(51) Int. Cl.
    *H03M 1/66* (2006.01)
(52) U.S. Cl. ............... 341/150; 341/143; 341/144; 341/155; 341/172
(58) Field of Classification Search ............... 341/150, 341/172
    See application file for complete search history.

(56) References Cited

U.S. PATENT DOCUMENTS

| | | | | |
|---|---|---|---|---|
| 5,691,720 | A | * | 11/1997 | Wang et al. ............... 341/143 |
| 5,838,270 | A | | 11/1998 | Kiriaki ............... 341/143 |
| 6,040,793 | A | * | 3/2000 | Ferguson et al. ............ 341/143 |
| 6,081,218 | A | * | 6/2000 | Ju et al. ............... 341/150 |
| 6,400,295 | B1 | * | 6/2002 | Van Herzeele ............... 341/143 |
| 6,437,720 | B1 | * | 8/2002 | Yin et al. ............... 341/150 |
| 6,744,394 | B1 | * | 6/2004 | Liu et al. ............... 341/155 |
| 6,972,705 | B1 | * | 12/2005 | Fei et al. ............... 341/143 |

FOREIGN PATENT DOCUMENTS

EP    1102405    5/2001

OTHER PUBLICATIONS

R. W. Andrews et al.; "Theory And Practical Implementation Of A Fifth-Order Sigma-Delta A/D Computer"; Journal of The Audio Engineer Society vol. 39, No. 7/8; pp. 515-528, Jul. 1, 1991.
D. A. Kerth et al.; "An Oversampling Converter For Strain Gauge Transducers"; IEEE Journal of Solid-State Circuits, vol. 27 No. 12, pp. 1689-1696, Dec. 1, 1992.
M. A. Alexander et al.; "A 192KS/S Sigma-Delta ADC With Integrated Decimation Filters Providing 97.4DB THD"; IEEE International Solid State Circuits Conference, vol. 37, pp. 190-191, 336, Feb. 1, 1994.
PCT International Search Report and Written Opinion; PCT/US2005/028519; 13 Pgs, Date Mailed: Sep. 11, 2005.

* cited by examiner

*Primary Examiner*—Rexford Barnie
*Assistant Examiner*—Khai Nguyen
(74) *Attorney, Agent, or Firm*—Baker Botts L.L.P.

(57) ABSTRACT

A five-level feed-back digital-to-analog converter (DAC) in a switched capacitor sigma-delta analog-to-digital converter has an improved switching sequence that boosts from two to five the number of quantization levels of the feed-back DAC. Switching sequences are used to obtain five equally distributed charge levels $C*V_{REF}$, $C*V_{REF}/2$, 0, $-C*V_{REF}/2$ and $-C*V_{REF}$. When summed with an input voltage, $V_{IN}$, the five-level feed-back DAC produces five equally distributed output voltages of $A*V_{IN}+V_{REF}$, $A*V_{IN}+V_{REF}/2$, $A*V_{IN}+0$, $A*V_{IN}-V_{REF}/2$ and $A*V_{IN}-V_{REF}$, where A is gain, $V_{IN}$ is the input voltage, and $V_{REF}$ is the reference voltage.

17 Claims, 3 Drawing Sheets

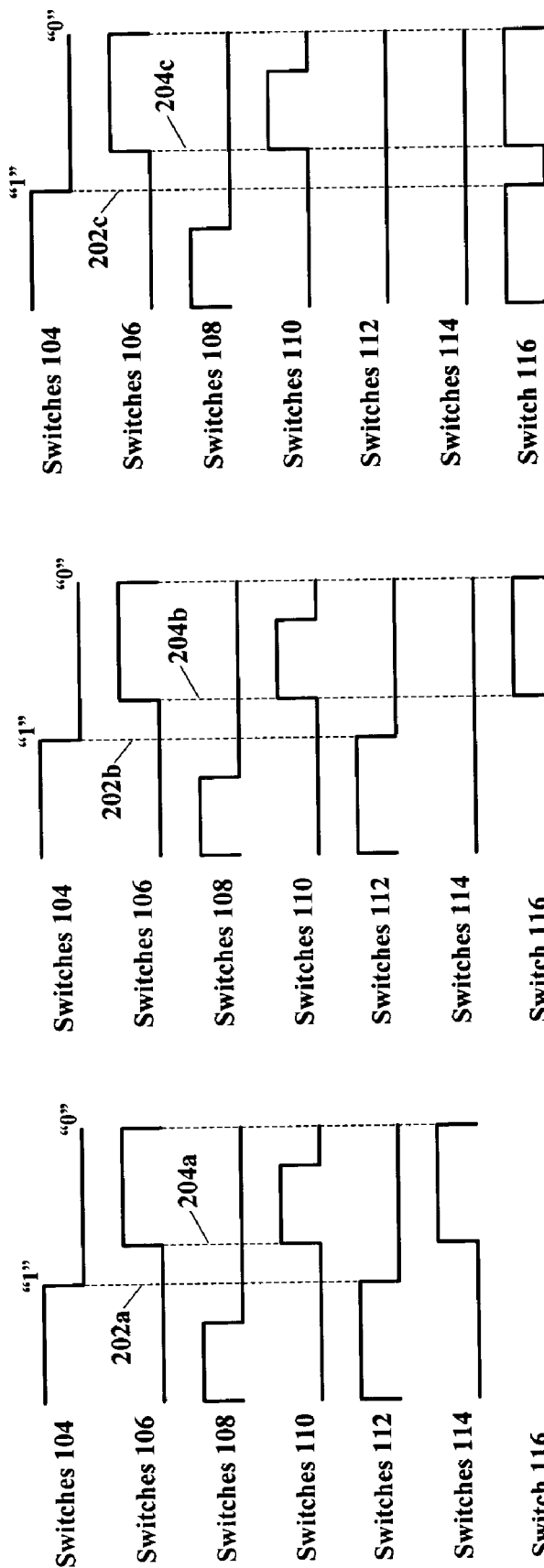
FIGURE 2c  FIGURE 2b  FIGURE 2a

FIVE-LEVEL FEED-BACK DIGITAL-TO-ANALOG CONVERTER FOR A SWITCHED CAPACITOR SIGMA-DELTA ANALOG-TO-DIGITAL CONVERTER

RELATED PATENT APPLICATION

This application claims priority to commonly owned U.S. Provisional Patent Application Ser. No. 60/603,234; filed Aug. 20, 2004; entitled "Five-Level Digital-to-Analog Converter for a Switched Capacitor Sigma-Delta Analog-to-Digital Converter," by Philippe Deval; which is hereby incorporated by reference herein for all purposes.

TECHNICAL FIELD OF THE INVENTION

The present disclosure relates to analog-to-digital converters and, more particularly, to a switched capacitor sigma-delta analog-to-digital converter having a five-level feed-back digital-to-analog converter.

BACKGROUND OF THE RELATED TECHNOLOGY

Analog-to-digital converters are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor sigma-delta converter.

As many analog-to-digital converters, the switched capacitor sigma-delta converter uses a digital-to-analog converter in a feedback loop and cannot be more accurate than the digital-to-analog converter. Therefore a very accurate digital-to-analog converter is required in order to achieve an accurate analog-to digital conversion. However a high resolution is not required for the digital-to-analog converter used in the feedback loop of a sigma-delta converter: The digital-to-analog resolution can be exchanged with the over-sampling ratio at the cost of a longer conversion time.

A two-level digital-to-analog converter is inherently accurate and thus is not the limiting factor for the accuracy of a sigma-delta converter. Therefore it is the standard approach in a sigma-delta analog-to-digital converter.

However, what is needed is a reduction in quantization noise, over sampling ratio and power consumption of the sigma-delta analog-to-digital converter. Such a reduction is sometime achieved with a multi-level digital-to-analog converter but with the cost of an expensive trimming or a complicated dynamic element matching technique.

SUMMARY OF THE INVENTION

The invention overcomes the above-identified problems as well as other shortcomings and deficiencies of existing technologies by providing a five-level feed-back digital-to-analog converter (DAC) in a switched capacitor sigma-delta analog-to-digital converter. The five-level feed-back DAC has an improved switching sequence that boosts from two to five the number of quantization levels of the conventional feed-back DAC.

According to specific exemplary embodiments of the present invention, a switched capacitor sigma-delta converter architecture with an over sampling ratio is used, wherein a five-level feed-back DAC increases the signal to quantization noise ratio of the switched capacitor sigma-delta converter by about 8 dB. The five-level feed-back DAC also increases the stability range of the sigma-delta modulator of the analog-to-digital converter. The new, novel and non-obvious five-level switching sequence for the feed-back DAC may be advantageously utilized in place of the standard two level of DAC switching implementation, and does not require extra phases. Therefore the specific exemplary embodiments may be accomplished with only a few extra digital gates for generating the proper switching sequences for the five-level feed-back DAC.

Increasing to five the number of levels in the feed-back DAC helps to meet a very stringent signal-to noise ratio and to allow, in first order sigma delta converters, for a gain having a factor of two over sampling ratios used by prior technology two level feed-back DACs. This significantly helps in the integrator design and reduces the overall current consumption of the switched capacitor sigma-delta converter.

An advantage of the present invention is improved performance and very low-power consumption of a switched capacitor sigma-delta converter.

Another advantage is improved signal to quantization noise ratio of the switched capacitor sigma-delta converter.

Still another advantage is improved stability range of the switched capacitor sigma-delta modulator.

Other features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein:

FIGS. 2a–2e are timing diagrams for the switching sequences of the switches 104–116 used to obtain the five equally distributed charge levels: $C*V_{REF}$, $C*V_{REF}/2$, 0, $-C*V_{REF}/2$ and $-C*V_{REF}$ of the specific exemplary embodiment illustrated in FIG. 1.

Figure 1:
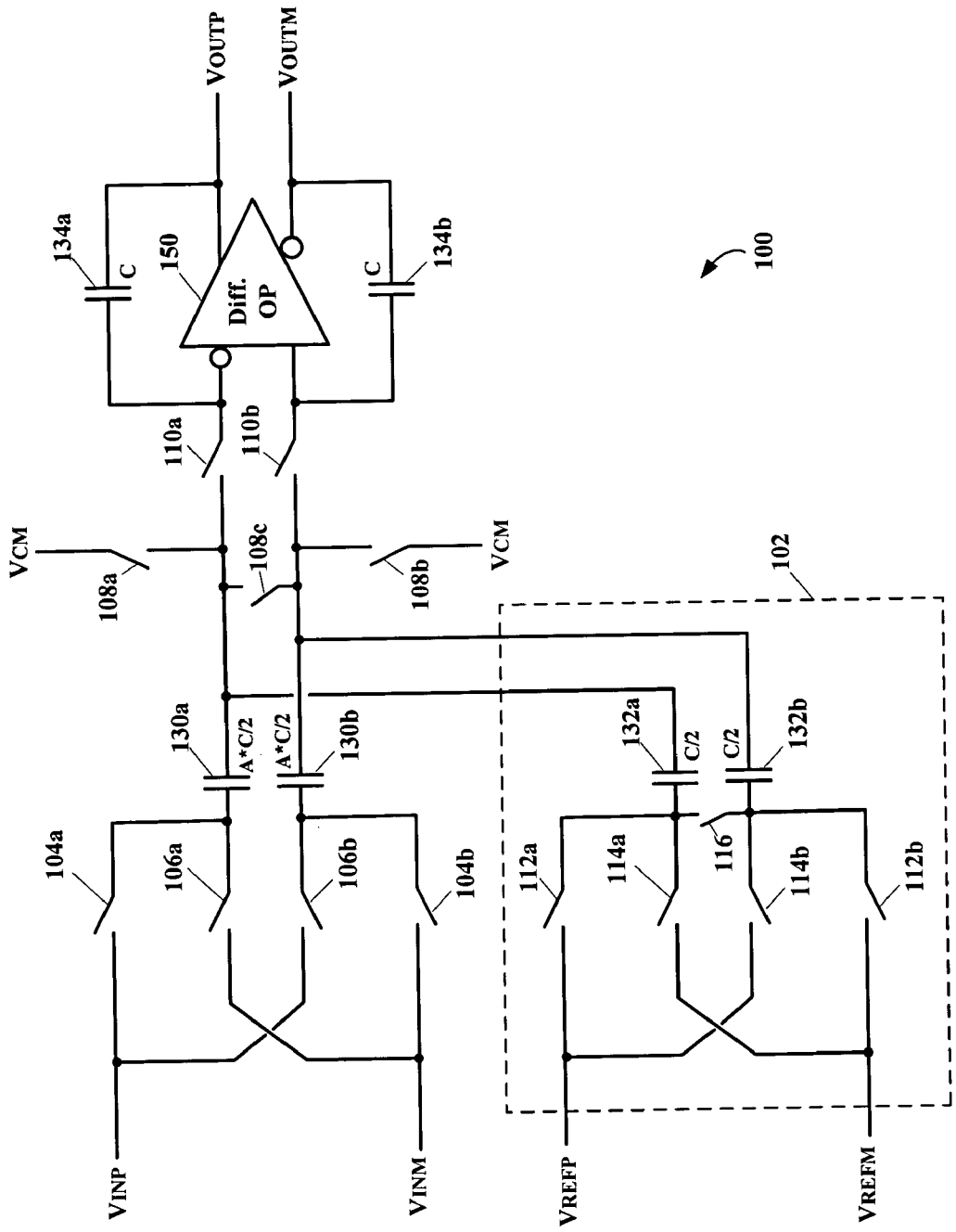
FIG. 1 is a schematic circuit diagram of capacitor switching arrays and a differential amplifier for a five level feed-back digital-to-analog converter (DAC), according to specific exemplary embodiments of the invention.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention utilizes an improved switching sequence that boosts the number of levels from two to five of a feed-back digital-to-analog converter (DAC) in a switched capacitor sigma-delta converter. Use of a five level feed-back DAC in a sigma-delta converter is a new, novel and non-obvious application.

Referring now to the drawings, the details of specific embodiments of the present invention are schematically illustrated. Like elements in the drawings will be represented by like numbers, and similar elements will be represented by like numbers with a different lower case letter suffix.

Referring to FIG. 1, depicted is a schematic circuit diagram of capacitor switching arrays and a differential amplifier for a five level feed-back digital-to-analog converter (DAC), according to specific exemplary embodiments of the invention. The five-level feed-back DAC, generally represented by the numeral 100, comprises a switching sequence that generates five equally spaced charge quantities during two phases (precharge+transfer) of a differential charge transfer. Thus, the five equally distributed charge levels may be $C*V_{REF}$, $C*V_{REF}/2$, 0, $-C*V_{REF}/2$ and $-C*V_{REF}$. The reference voltage ($V_{REF}=V_{REFP}-V_{REFM}$) charging circuit is generally represented by the numeral 102 and comprises transfer reference capacitors 132a and 132b, and switches 112, 114 and 116. The remainder of the specific exemplary embodiment comprises voltage input capacitors 130a and 130b, switches 104, 106, 108 and 110, and differential operational amplifier 150 having feed-back sampling capacitors 134a and 134b. Switches 108a and 108b may relate to common mode operation, and switch 108c may relate to differential signal operation.

$V_{REFP}$ and $V_{REFM}$ represent voltages at the differential reference input terminals. The reference voltage $V_{REF}=V_{REFP}-V_{REFM}$. $V_{INP}$ and $V_{INM}$ represent voltages at the differential input signal terminals. The input signal voltage $V_{IN}=V_{INP}-V_{INM}$. The transfer reference capacitors 132a and 132b may be equal to C/2. The input sampling capacitors 130a and 130b may be equal to A*C/2. The feed-back capacitors 134a and 134b may be equal to C. The input voltage is: $V_{IN}=V_{INP}-V_{INM}$, and the output voltage is: $V_{OUT}=V_{OUTP}-V_{OUTM}$. The gain of the circuit shown is A.

Referring to FIGS. 2a–2e, depicted are timing diagrams for the switching sequences of the switches 104–116 used to obtain the five equally distributed charge levels $C*V_{REF}$, $C*V_{REF}/2$, 0, $-C*V_{REF}/2$ and $-C*V_{REF}$ of the specific exemplary embodiment illustrated in FIG. 1. A "1" logic level depicts the respective switches in the closed position and a "0" logic level depicts the respective switches in the open position. FIGS. 2a–2e further illustrate the non-overlapping delays between the switches 104–116 in order to prevent a short between inputs and to ensure that the switches connected to the summing node always open first. The switches 104–116 are all open (off—logic 0) between time 202 and time 204. Time 202 signifies the end of the charging phase of the transfer reference capacitors 132a and 132b, and the sampled $V_{IN}$ charge on the input capacitors 130a and 130b. Time 204 signifies the beginning of the transfer phase of the charge on the transfer reference capacitors 132a and 132b.

Referring to FIG. 2a, depicted is the timing diagram for transferring a plus (positive) charge, $C*V_{REF}$. The transfer reference capacitors 132a and 132b are connected to $V_{REFP}$ and $V_{REFM}$, respectively, during the precharge phase (before time 202a) and switched to $V_{REFM}$ and $V_{REFP}$, respectively, during the transfer phase (after time 204a). The charge transferred is equal to $C/2*(V_{REFP}-V_{REFM})-C/2*(V_{REFM}-V_{REFP})=C*V_{REF}$. When summed with the voltage input sample charge, $A*C/2*(V_{INP}-V_{INM})-A*C/2*(V_{INM}-V_{INP})=A*C*V_{IN}$ at the summing node of the input of the differential operational amplifier 150, the transferred voltage is $A*V_{IN}+V_{REF}$ at the output of the differential operational amplifier 150.

Figure 2E:
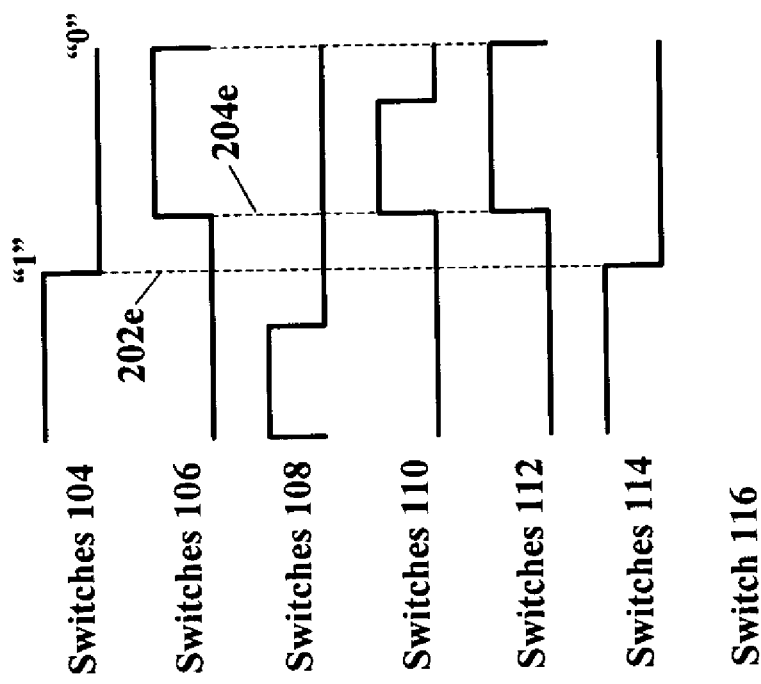

Referring to FIG. 2e, depicted is the timing diagram for transferring a minus (negative) charge, $C*-V_{REF}$. The opposite sequence from that shown in FIG. 2a is performed to achieve a $-C*V_{REF}$ charge to the summing node. When summed with the voltage input sample charge, $A*C/2*(V_{INP}-V_{INM})-A*C/2*(V_{INM}-V_{INP})=A*C*V_{IN}$ at the summing node of the input of the differential operational amplifier 150, the transferred voltage is $A*V_{IN}-V_{REF}$ at the output of the differential operational amplifier 150. The charging and transferring sequences of FIGS. 2a and 2e represent a basic two level feed-back DAC of a sigma-delta modulator.

According to specific exemplary embodiments of the invention, three more charge levels are added to the basic operation of the aforementioned two-level feed-back DAC in order to achieve a five-level DAC. These three additional charge levels are $C/2*V_{REF}$, 0 and $-C/2*V_{REF}$.

Referring to FIG. 2b, in order to achieve a $C/2*V_{REF}$ charge transfer, the transfer reference capacitors 132a and 132b are connected to $V_{REFP}$ and $V_{REFM}$, respectively, during the precharge phase (before time 202b) and have their input plates short-circuited during the transfer phase (after time 204b). The charge transferred is then equal to $C/2*(V_{REFP}-V_{REFM})-0=C/2*V_{REF}$. When summed with the voltage input sample charge, $A*C/2*(V_{INP}-V_{INM})-A*C/2*(V_{INM}-V_{INP})=A*C*V_{IN}$ at the summing node of the input of the differential operational amplifier 150, the transferred voltage is $A*V_{IN}+V_{REF}/2$ at the output of the differential operational amplifier 150.

Referring to FIG. 2c, in order to achieve a zero charge transfer, the input plates of the transfer reference capacitors 132a and 132b are short-circuited during both the precharge phase (before time 202c) and the transfer phase (after time 204c). When summed with the voltage input sample charge, $A*C/2*(V_{INP}-V_{INM})-A*C/2*(V_{INM}-V_{INP})=A*C*V_{IN}$ at the summing node of the input of the differential operational amplifier 150, the transferred voltage is $A*V_{IN}+0$ at the output of the differential operational amplifier 150.

Figure 2D:
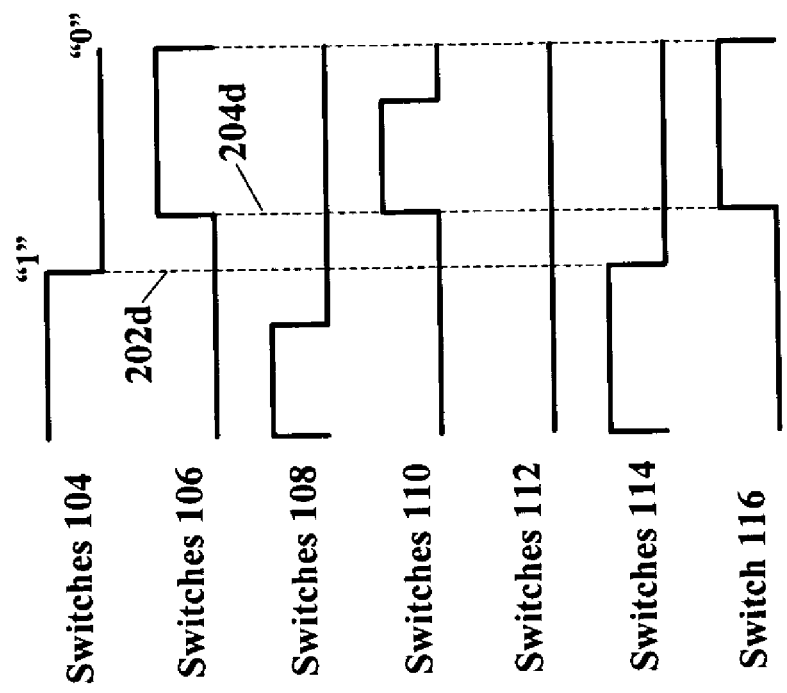

Referring to FIG. 2d, In order to achieve a $-C/2*V_{REF}$ charge transfer, the transfer reference capacitors 132a and 132b are connected to $V_{REFM}$ and $V_{REFP}$, respectively, during the precharge phase (before time 202d) and have their input plates short-circuited during the transfer phase (after time 204d). The charge transferred is then equal to $C/2*(V_{REFM}-V_{REFP})-0=-C/2*V_{REF}$. When summed with the voltage input sample charge, $A*C/2*(V_{INP}-V_{INM})-A*C/2*(V_{INM}-V_{INP})=A*C*V_{IN}$ at the summing node of the input of the differential operational amplifier 150, the transferred voltage is $A*V_{IN}-V_{REF}/2$ at the output of the differential operational amplifier 150.

It is also contemplated and within the scope of the present invention that the intermediate levels $C*V_{REF}/2$, 0 and $-C*V_{REF}/2$ can also be achieved through other switching sequences then what are described herein. E.g., short-circuiting the input plates of transfer reference capacitors 132a and 132b during precharge and connecting them to $V_{REFM}$ and $V_{REFP}$, respectively, generates a $C*V_{REF}/2$ charge transfer. In a similar fashion, short-circuiting the input plates of transfer reference capacitors 132a and 132b during precharge and connecting them to $V_{REFP}$ and $V_{REFM}$, respectively, generates a $-C*V_{REF}/2$ charge transfer. Maintaining connection of the input plates of transfer reference capacitors 132a and 132b to the same potential during the precharge and transfer phases induces a zero charge transfer.

FIG. 1 depicts a two phase implementation (charge and transfer) where the signal ($V_{INP}-V_{INM}$) and reference ($V_{REFP}-V_{REFM}$) are processed in parallel with the signal path having a gain A. It is contemplated and within the scope of the present invention that a four (4) phase scheme may be applied where the signal ($V_{INP}-V_{INM}$) and reference ($V_{REFP}-V_{REFM}$) share the same capacitors (capacitors 130 and 132 become the same capacitors) in order to have an accurate gain of one (1) that is matching insensitive. It is contemplated and within the scope of the present invention that any multiphase scheme may be applied as well as rotating capacitor gain techniques or dynamic matching.

The invention, therefore, is well adapted to carry out the objects and attain the ends and advantages mentioned, as well as others inherent therein. While the invention has been depicted, described, and is defined by reference to specific embodiments of the invention, such references do not imply a limitation on the invention, and no such limitation is to be inferred. The invention is capable of considerable modification, alteration, and equivalents in form and function, as will occur to those ordinarily skilled in the pertinent arts and having the benefit of this disclosure. The depicted and described specific embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A reference voltage switching arrangement for a five level feed-back digital-to-analog converter used with a switched capacitor sigma-delta analog-to-digital converter, said reference voltage switching arrangement comprising:
    a plus reference voltage capacitor having a capacitance of C/2;
    a minus reference voltage capacitor having a capacitance of C/2;
    a first pair of switches adapted for switchably coupling the plus and minus reference voltage capacitors to plus and minus reference voltages, respectively;
    a second pair of switches adapted for switchably coupling the plus and minus reference voltage capacitors to the minus and the plus reference voltages, respectively; and
    a third switch adapted for switchably coupling the plus and minus reference voltage capacitors together, wherein the first pair of switches, the second pair of switches, and the third switch are sequenced in a charge phase and a transfer phase to produce five equally distributed charge levels of $C*V_{REF}$, $C*V_{REF}/2$, 0, $-C*V_{REF}/2$ and $-C*V_{REF}$, where $V_{REF}$ is a reference voltage.

2. The reference voltage switching arrangement according to claim 1, wherein the charge phase and transfer phase switching sequences of the first pair of switches, the second pair of switches, and the third switch do not overlap.

3. The reference voltage switching arrangement according to claim 1, wherein for the charge level of $C*V_{REF}$:
    the first pair of switches are closed during the charge phase and open during the transfer phase;
    the second pair of switches are open during the charge phase and closed during the transfer phase; and
    the third switch is open during the charge phase and the transfer phase.

4. The reference voltage switching arrangement according to claim 1, wherein for the charge level of $C*V_{REF}/2$:
    the first pair of switches are closed during the charge phase and open during the transfer phase;
    the second pair of switches are open during the charge phase and the transfer phase; and
    the third switch is open during the charge phase and closed during the transfer phase.

5. The reference voltage switching arrangement according to claim 1, wherein for the charge level of 0:
    the first pair of switches are open during the charge phase and the transfer phase;
    the second pair of switches are open during the charge phase and the transfer phase; and
    the third switch is closed during the charge phase and the transfer phase.

6. The reference voltage switching arrangement according to claim 1, wherein for the charge level of $-C*V_{REF}/2$:
    the first pair of switches are open during the charge phase and the transfer phase;
    the second pair of switches are closed during the charge phase and open during the transfer phase; and
    the third switch is open during the charge phase and closed during the transfer phase.

7. The reference voltage switching arrangement according to claim 1, wherein for the charge level of $-C*V_{REF}$:
    the first pair of switches are open during the charge phase and closed during the transfer phase;
    the second pair of switches are closed during the charge phase and open during the transfer phase; and
    the third switch is open during the charge phase and the transfer phase.

8. A five level feed-back digital-to-analog converter for a switched capacitor sigma-delta analog-to-digital converter, said five level feed-back digital-to-analog converter comprising:
    a plus input voltage capacitor having a capacitance of $A*C/2$;
    a minus input voltage capacitor having a capacitance of $A*C/2$;
    a first pair of switches adapted for switchably coupling the plus and minus input voltage capacitors to plus and minus input voltages, respectively;
    a second pair of switches adapted for switchably coupling the plus and minus input voltage capacitors to the minus and the plus input voltages, respectively;
    a plus reference voltage capacitor having a capacitance of C/2;
    a minus reference voltage capacitor having a capacitance of C/2;
    a fifth pair of switches adapted for switchably coupling the plus and minus reference voltage capacitors to plus and minus reference voltages, respectively;
    a sixth pair of switches adapted for switchably coupling the plus and minus reference voltage capacitors to the minus and the plus reference voltages, respectively; and
    a seventh switch adapted for switchably coupling the plus and minus reference voltage capacitors together;
    a third plurality of switches coupled to the plus and minus input voltage capacitors and the plus and minus reference voltage capacitors, and adapted for switchably coupling a common mode voltage, $V_{CM}$, to these capacitors; and
    a fourth pair of switches adapted for coupling the plus and minus input voltage capacitors and the plus and minus reference voltage capacitors to a differential input of an amplifier,
    wherein the switches are sequenced in a charge phase and a transfer phase to produce five equally distributed voltage outputs from the amplifier of $A*V_{IN}+V_{REF}$, A*V$_{IN}$+V$_{REF}$/2, A*V$_{IN}$+0, A*V$_{IN}$−V$_{REF}$/2 and A*V$_{IN}$−V$_{REF}$, where A is gain, V$_{IN}$ is an input voltage, and V$_{REF}$ is a reference voltage.

9. The five level feed-back digital-to-analog converter according to claim 8, wherein the charge phase and transfer phase switching sequences of the switches do not overlap.

10. The five level feed-back digital-to-analog converter according to claim 8, wherein for the voltage output of A*V$_{IN}$+V$_{REF}$:
the first pair of switches are closed during the charge phase and open during the transfer phase;
the second pair of switches are open during the charge phase and closed during the transfer phase;
the third plurality of switches are closed during the charge phase and open during the transfer phase;
the fourth pair of switches are open during the charge phase and closed during the transfer phase;
the fifth pair of switches are closed during the charge phase and open during the transfer phase;
the sixth pair of switches are open during the charge phase and closed during the transfer phase; and
the seventh switch is open during the charge phase and the transfer phase.

11. The five level feed-back digital-to-analog converter according to claim 8, wherein for the voltage output of A*V$_{IN}$+V$_{REF}$/2:
the first pair of switches are closed during the charge phase and open during the transfer phase;
the second pair of switches are open during the charge phase and closed during the transfer phase;
the third plurality of switches are closed during the charge phase and open during the transfer phase;
the fourth pair of switches are open during the charge phase and closed during the transfer phase;
the fifth pair of switches are closed during the charge phase and open during the transfer phase;
the sixth pair of switches are open during the charge phase and the transfer phase; and
the seventh switch is open during the charge phase and closed during the transfer phase.

12. The five level feed-back digital-to-analog converter according to claim 8, wherein for the voltage output of A*V$_{IN}$+0:
the first pair of switches are closed during the charge phase and open during the transfer phase;
the second pair of switches are open during the charge phase and closed during the transfer phase;
the third plurality of switches are closed during the charge phase and open during the transfer phase;
the fourth pair of switches are open during the charge phase and closed during the transfer phase;
the fifth pair of switches are open during the charge phase and the transfer phase;
the sixth pair of switches are open during the charge phase and the transfer phase; and
the seventh switch is closed during the charge phase and the transfer phase.

13. The five level feed-back digital-to-analog converter according to claim 8, wherein for the voltage output of A*V$_{IN}$−V$_{REF}$/2:
the first pair of switches are closed during the charge phase and open during the transfer phase;
the second pair of switches are open during the charge phase and closed during the transfer phase;
the third plurality of switches are closed during the charge phase and open during the transfer phase;
the fourth pair of switches are open during the charge phase and closed during the transfer phase;
the fifth pair of switches are open during the charge phase and the transfer phase;
the sixth pair of switches are closed during the charge phase and open during the transfer phase; and
the seventh switch is open during the charge phase and closed during the transfer phase.

14. The five level feed-back digital-to-analog converter according to claim 8, wherein for the charge level of A*V$_{IN}$−V$_{REF}$:
the first pair of switches are closed during the charge phase and open during the transfer phase;
the second pair of switches are open during the charge phase and closed during the transfer phase;
the third plurality of switches are closed during the charge phase and open during the transfer phase;
the fourth pair of switches are open during the charge phase and closed during the transfer phase;
the fifth pair of switches are open during the charge phase and closed during the transfer phase;
the sixth pair of switches are closed during the charge phase and open during the transfer phase; and
the seventh switch is open during the charge phase and the transfer phase.

15. The five level feed-back digital-to-analog converter according to claim 8, wherein the amplifier is a differential input and output operational amplifier.

16. A method for producing five reference voltage levels in a feed-back digital-to-analog converter used with a switched capacitor sigma-delta analog-to-digital converter, said method comprising the steps of:
providing a plus reference voltage capacitor having a capacitance of C/2;
providing a minus reference voltage capacitor having a capacitance of C/2;
producing a charge level of C*V$_{REF}$ by
coupling the plus and minus reference voltage capacitors to plus and minus reference voltages, respectively, during a charge phase, and
coupling the plus and minus reference voltage capacitors to the minus and the plus reference voltages, respectively, during a transfer phase;
producing a charge level of C*V$_{REF}$/2 by
coupling the plus and minus reference voltage capacitors to the plus and minus reference voltages, respectively, during the charge phase, and
coupling the plus and minus reference voltage capacitors together, during the transfer phase;
producing a charge level of 0 by
coupling the plus and minus reference voltage capacitors together during the charge phase and the transfer phase;
producing a charge level of −C*V$_{REF}$/2 by
coupling the plus and minus reference voltage capacitors to the minus and the plus reference voltages, respectively, during the charge phase; and
coupling the plus and minus reference voltage capacitors together, during the transfer phase; and
producing a charge level of −C*V$_{REF}$ by
coupling the plus and minus reference voltage capacitors to the minus and the plus reference voltages, respectively, during the charge phase; and coupling the plus and minus reference voltage capacitors to the plus and minus reference voltages, respectively, during the transfer phase.

17. The method according to claim 16, further comprising the steps of:
providing a plus input voltage capacitor having a capacitance of A*C/2;
providing a minus input voltage capacitor having a capacitance of A*C/2;
coupling the plus and minus input voltage capacitors to plus and minus input voltages, respectively, during the charge phase;
coupling the plus and minus input voltage capacitors to the minus and plus input voltages, respectively, during the transfer phase;
coupling the plus and minus reference voltage capacitors and the plus and minus input voltage capacitors to a common mode voltage during the charge phase; and
coupling the plus and minus reference voltage capacitors and the plus and minus input voltage capacitors to a differential input of an amplifier during the transfer phase,
wherein the amplifier produces five equally distributed output voltages of $A*V_{IN}+V_{REF}$, $A*V_{IN}+V_{REF}/2$, $A*V_{IN}+0$, $A*V_{IN}-V_{REF}/2$ and $A*V_{IN}-V_{REF}$, where A is gain, $V_{IN}$ is the input voltage, and $V_{REF}$ is the reference voltage.

* * * * *